United States Patent [19]

Steele

[11] Patent Number: 4,613,313
[45] Date of Patent: Sep. 23, 1986

[54] IONIZATION DETECTOR

[75] Inventor: Douglas S. Steele, Saratoga Springs, N.Y.

[73] Assignee: General Electric Company, Cincinnati, Ohio

[21] Appl. No.: 565,670

[22] Filed: Dec. 27, 1983

[51] Int. Cl.⁴ ............................................. G01N 23/00
[52] U.S. Cl. ........................................ 445/28; 445/35; 445/59; 250/374; 156/634; 29/446
[58] Field of Search ..................... 445/28, 35, 37, 59; 156/631, 634, 652, 656; 250/374, 385; 29/446

[56] References Cited

U.S. PATENT DOCUMENTS

| | | | |
|---|---|---|---|
| 1,963,834 | 6/1934 | Decker | 156/631 |
| 3,135,823 | 6/1964 | Pritikin | 156/901 X |
| 3,429,080 | 2/1969 | Lachapelle | 51/309 |
| 4,003,392 | 1/1977 | Schaefer | 134/30 |
| 4,064,660 | 12/1977 | Lampert | 51/283 R |
| 4,161,655 | 7/1979 | Cotic et al. | 250/385 |
| 4,203,257 | 5/1980 | Jamison et al. | 51/2 R |
| 4,227,039 | 10/1980 | Shibasaki et al. | 156/634 X |
| 4,260,891 | 4/1981 | Williams | 250/385 |
| 4,392,237 | 7/1983 | Houston | 250/385 X |
| 4,394,578 | 7/1983 | Houston et al. | 250/374 |

Primary Examiner—Kenneth J. Ramsey
Attorney, Agent, or Firm—Gregory A. Welte; Derek P. Lawrence

[57] ABSTRACT

The present invention relates to detectors used in X-ray tomographic imaging. The invention describes a xenon ionization detector having individual detector elements spaced 1.5 mil apart, thus providing high resolution. In one embodiment, a procedure is described for reducing a spurious electric current which was found to arise when such narrow spacings were used.

4 Claims, 27 Drawing Figures

IONIZATION DETECTOR

The present invention relates to ionization detectors and, more particularly, to such detectors as used in X-ray tomography.

BACKGROUND OF THE INVENTION

X-ray tomography entails the multiple X-ray photographing of an object from the sides in order to derive, by computer, a view from the top. However, when it is desired to increase the resolution of the tomography, i.e., to see smaller parts of the object, numerous problems are encountered.

For example, one problem results from the type of detector used in X-ray tomography. X-ray film is not used because the cost would be prohibitive (because of the multiplicity of photographs needed) and also because it is difficult to transfer data from such a detector (i.e., film) to a computer. Instead, the detectors actually used are generally small, discrete sensors which respond to x-radiation. In order to achieve increased resolution, smaller sensors must be used, packed closely together. Clearly, there arise problems in manufacturing very small sensors which are spaced very close to each other.

Apart from manufacturing challenges faced in the manufacture of high resolution tomography sensors, many of the prior art tomography apparatus function well only in controlled environments. Applicant has discovered improvements which eliminate the necessity of maintaining a controlled environment and which allow such tomograph apparatus to be implemented in an abusive environment, such as at a manufactureing site, and, further, to be used on a continual, uninterrupted basis. Such improvements have significant relevance to the tomographic examination of gas turbine engine parts, including turbine blades.

Figure 1:
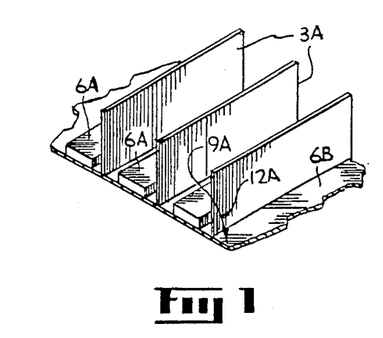
FIG. 1 illustrates a prior art detector.

In addition, one form of prior art ionization detector utilizes baffles 3A positioned between adjacent detectors 6A as shown in FIG. 1. The baffles function to prevent an ionized particle 9A from following a path 12A and thus falling upon a detector other than the detector directly beneath it, namely, detector 6B.

OBJECTS OF THE INVENTION

It is an object of the present invention to provide a new and improved X-ray detector for use in tomography.

It is a further object of the present invention to provide a new and improved X-ray detector for continued, uninterrupted use.

SUMMARY OF THE INVENTION

In one form of the present invention, a chamber is defined by a housing. A substrate enters the chamber from outside the housing and the substrate supports a plurality of elongated detector elements for capturing electric charges which are generated by ionization events occurring above the elements. The present invention provides mechanical improvements in the housing for improved containment of the ionizing medium, which is preferably xenon gas, and provides a method for removing the causes of spurious charges supplied by the detectors.

DETAILED DESCRIPTION OF THE INVENTION

Figure 2:
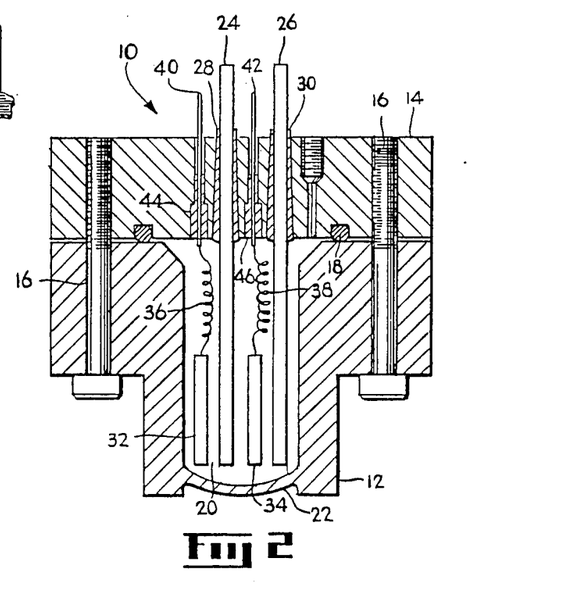
FIG. 2 illustrates a prior art ionization detector.

One existing X-ray detector is that described in U.S. Pat. No. 4,394,578, entitled "High Pressure, High Resolution Xenon X-Ray Detector Array" by John Mapes Houston and Nathan Rey Whetten, which is hereby incorporated by reference. FIG. 2 herein is similar to FIG. 2 of Houston, et al., and the following passage describing this Figure is taken from the Houston, et al., patent, pages 4 and 5.

"An X-ray detector built according to the instant invention is shown in FIG. 2. The detector 10 includes a generally-cylindrical housing 12 of a metal or metal alloy having an end plate 14 of metal or metal alloy attached thereto by, for example, bolts 16. The end plate 14 is sealed to the housing 12 by an O-ring seal 18 made of compressible material, such as rubber. The housing 12 includes a generally cylindrical chamber 20 closed at one end by a window 22 made of a thin sheet of material readily penetrated by X-rays, for example, aluminum. The opposite end of the chamber 20 is closed by the end plate 14. Extending through end plate 14 are collector plates 24, 26 which are sealed by tapered epoxy seals 28, 30, respectively. Also disposed in the chamber are voltage plates 32, 34 connected via electrical conductors 36, 38, respectively, to electrical contacts 40, 42, respectively, which extend through the end plate 14 and are sealed thereto with gaskets 44, 46, respectively. It is to be understood that a detector may employ a single collector plate and voltage plate, or any practical number thereof."

Figure 3:
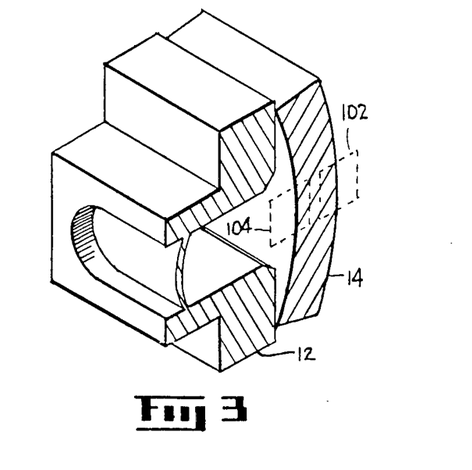
FIG. 3 illustrates bowing encountered in prior art housings.

Applicant has found that, when the chamber 20 is pressurized with xenon gas to a pressure of about 1100 psi, the end plate 14 exhibits the characteristic of bowing as shown in exaggerated form in FIG. 3. The bowing is similar to that of a circular diaphragm having a slit when subjected to pressure on one side. The bowing of the end plate 14 applies tensile forces to the epoxy seals 28 and 30 of FIG. 2 in the region 102 in FIG. 3 (seals not shown in FIG. 3) and applies compressive forces to the seals in region 104. These forces can reduce the useful lifetimes of the seals.

Figure 4:
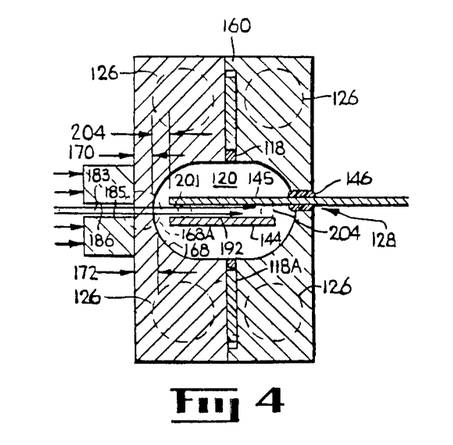
FIG. 4 is a cross-sectional view of one form of the present invention.
Figure 5:
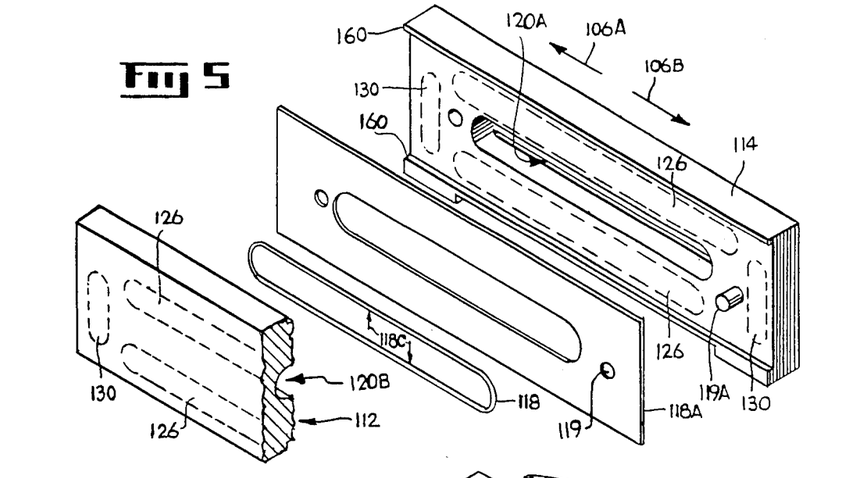
FIG. 5 is an exploded view of one form of the present invention.

Applicant reduces the bowing by constructing a generally rectangular (i.e., noncylindrical) chamber 120 within a housing 112 which is shown in cross section in FIG. 4 and in exploded form in FIG. 5. The chamber is elongated in the directions of arrows 106A and B. Similarly, the end plate 114 is also elongated, thus lessening its resemblance to a circular diaphragm and reducing the tendency of the end plate 114 to behave as a circular diaphragm.

Above and below the chamber 120 are regions of material contained within the dashed lines 126 which act as reinforcing webs, each similar to the web of a girder. The web functioning is more clearly shown in FIG. 6, wherein the material within dashed lines is symbolically shown as I-beams 126A. The pressure exerted on the end plate 114 by the xenon gas tends to bend, (i.e., "bow") the I-beams 126A as shown by dashed beam 126B. However, the webs 126C tend to resist this bending. Thus, the material in regions 126 in FIG. 4 resists bowing as do the I-beams 126A in FIG. 6.

Figure 7:
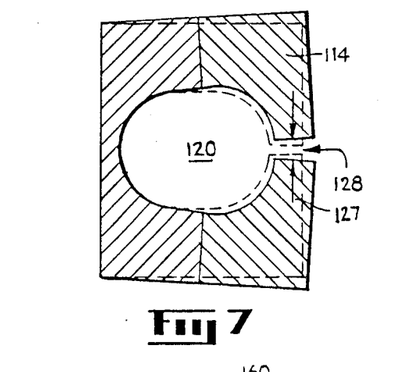
FIG. 7 illustrates yawning encountered in prior art housings.

The rectangular structure of the end plate working together with the reinforcing material in regions 126, while reducing bowing, have introduced a tendency for the the assembly to "yawn." This is shown in grossly exaggerated form in FIG. 7. Yawning results in an increase in dimension 127. The yawning is, in part, a result of the lack of material having high tensile strength within a slot 128. The yawning subjects the sealant within the slot (later described more fully) to tensile forces.

Figure 6:
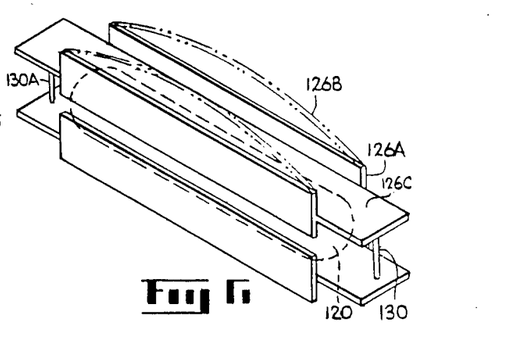
FIG. 6 schematically illustrates I-beams and cables which represent design features of the present invention used to reduce bowing and yawning.

Applicant reduces yawning by providing reinforcing material in regions 130 in FIG. 5. This material is subject to tensile forces when the chamber is pressurized. The functioning of the material in region 130 is schematically shown in FIG. 6, wherein cables 130A are shown as holding together the I-beams 126A. That is, the I-beams 126A described earlier inhibit bowing and the cables 130A inhibit yawning. These symbolic cables and I-beams take the form of solid material in regions 126 and 130 of FIG. 5 for ease of construction.

Figure 8:
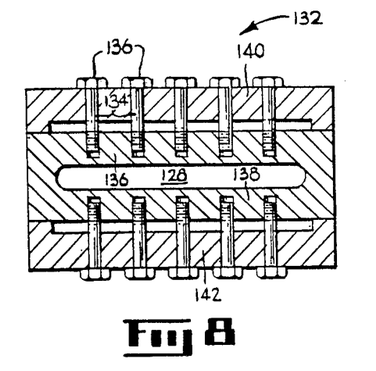
FIGS. 8 AND 9 illustrates a load cell for expanding a slot of the present invention.
Figure 9:
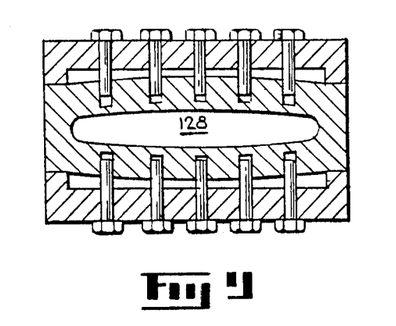

In order to further reduce the tensile forces acting upon the seal within the slot 128, Applicant pre-loads the end plate 114 by placing it into a loading cell 132 in FIG. 8. Holes 134 are drilled into the top 136 and bottom 138 of the end plate 114 and these holes are tapped with threads. Bolts 136 (10 in number) are threaded into the holes 134 and are anchored to respective beams 140 and 142. These bolts are 0.190 inches in diameter and have a thread pitch of 0.031 inches. Tightening of the bolts 136, to a torque of 12 foot pounds each tends to widen the slot 128 as shown in exaggerated form in FIG. 9A. When the slot is in this widened condition, voltage and collector boards 144 and 145 in FIG. 4 (later described more fully) analogous to plates 24 and 32 in FIG. 2 are inserted through slot 128 and an epoxy cement is packed into the space surrounding the collector boards 145 to establish the seal 146 mentioned above. After the cement has hardened, the pressure of the bolts 136 is removed, thus compressing the epoxy seal 146 and pre-loading it. Subsequent pressurization of the chamber 120 serves to unload the epoxy seal and tends to return it to an unloaded condition.

This pre-loading of the epoxy exploits the fact that the epoxy is stronger in compression than in tension. When the chamber 120 in FIG. 4 is pressurized, the compressive load on the epoxy is reduced (through yawning), and the pressurized xenon places a shear load on it. This is in distinction to the situation of FIG. 2 in which the epoxy is not pre-loaded, in which case the yawning of the assembly places the epoxy in tension, and the pressurized xenon places the epoxy in shear. This latter combination of tension and shear loads on the epoxy does not utilize the inherent strengths of the epoxy to advantage, as does the pre-loaded epoxy of FIG. 4.

In FIG. 5, a chamber 120 is defined by both the generally rectangular housing 112 and the rectangular end plate 114. A stainless steel gasket 118, which is circular in cross section, is supported by a plate 118A having a hole 119 of similar shape to that of gasket 118. A pin 119A engages a hole 119 in the plate to align this hole with the cavities 120A and 120B. The plate 118A fits between two lips 160 contained in the end plate 114, as shown in cross section in FIG. 4. The lips 160 also align the cavities 120A and B.

The housing 112 in FIG. 4 is constructed of a material which is permeable to X-rays, such as aluminum. A window 165 having an inner surface 168 which is generally cylindrical is provided such that dimension 170 is approximately one-eighth inch, resulting in a one-eighth inch thick window through which the X-rays can pass. As further shown in FIG. 4, the window is not uniformly thick, but dimension 172 is greater than dimension 171. Applicant has found that this differential in window thickness does not significantly affect X-ray detection. Thus, the desirable features of the cylindrical inner surface 168 in resisting the forces of the pressurized gas can be utilized despite the variations in thickness across the window surface which the cylindrical surface 168 provides.

Characterized another way, the window 165 is a plano-concave aluminum lens, in that surface 168 is concave and surface 174 is planar.

Figures 10, 17, 18, 19:
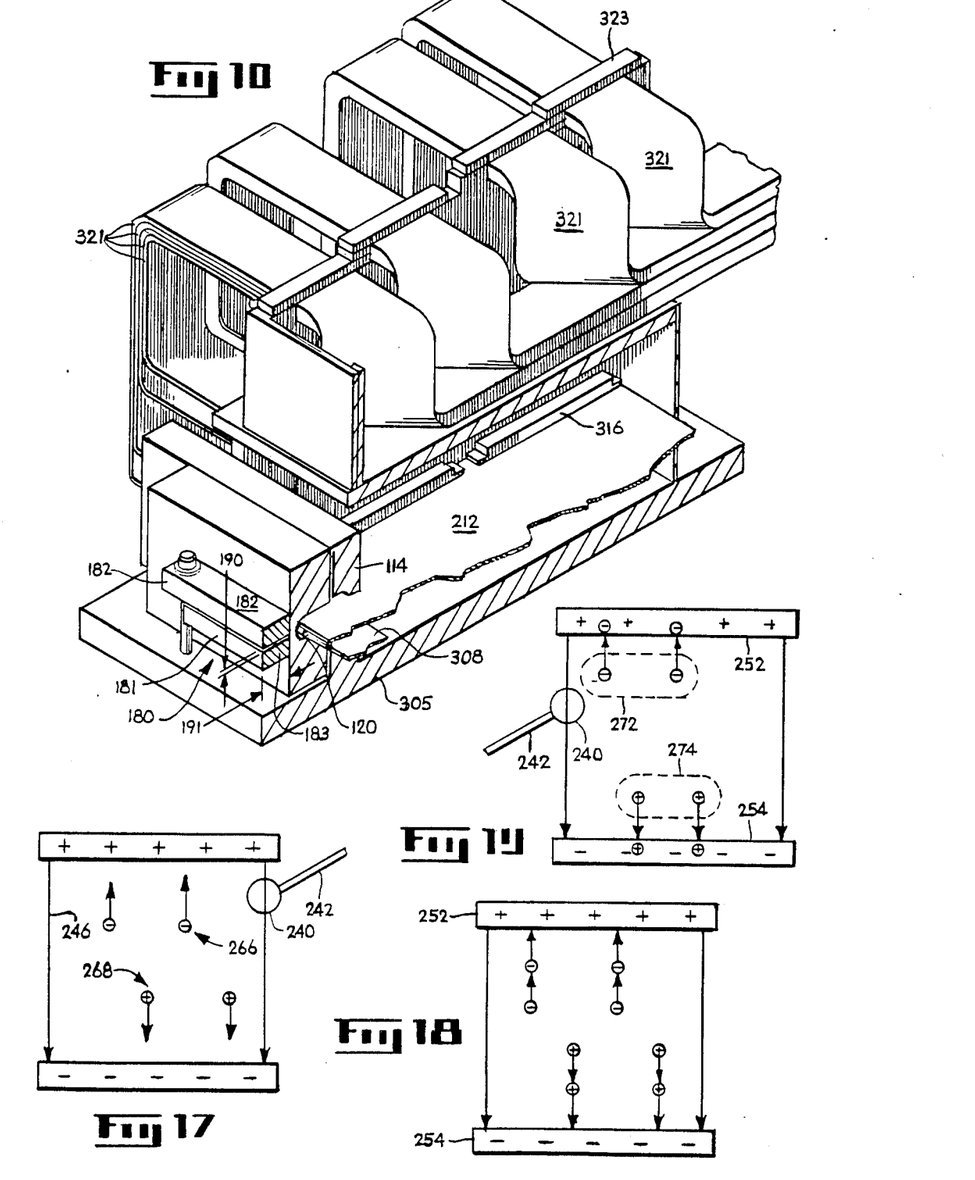
FIG. 10 illustrates a cut-away view of one form of the present invention.
FIGS. 14–19 illustrate some aspects of plasmas.

A collimator 180 in FIG. 10 is provided which comprises two bars 181 and 182 constructed of tungsten (an X-ray absorbing material) and defining a slit 183 between parallel faces 185 and 186 in FIG. 4. The slit 183 in FIG. 10 is 0.0115 inches in height (dimension 190) and 3.455 inches wide (dimension 191). Accordingly, the X-rays entering the chamber 120 are collimated to be substantially parallel, as shown by lines 192 in FIG. 4, and travel as a thin sheet into the chamber.

When the detector board is positioned within the slot 128, it is positioned such that the array (later described) of elements on the board 145 in FIG. 4 is parallel to the sheet of collimated X-rays. One reason for this is that the distance from an ionization event to the element array on the board must be the same irrespective of whether the ionization event occurs near the window 165 in FIG. 4, as in region 201, or farther from it, in region 204.

Further, at the time of positioning, the board 145 is positioned so that, when the end plate 114 is fastened to the housing 112, the distance 204 between the end of the board 145 and the window is as small as feasible. Applicant has used a distance of 0.015 inches. The distance is desired to be small in order to reduce the travel of ions through the space defined between the board and the window. However, there must exist at least some distance to prevent electrical arcing between the board and the window, inasmuch as a potential difference of several hundred volts exists between the two.

The positioning of the boards as described prior to assembly of the end plate 114 to the housing 112 provides the additional benefit of locating the board at a predetermined position with respect to the collimator 180 and the window 165. It is important to know this position because the signal analysis (not herein discussed) of ionization events would be affected if the board 145 were positioned at a different location, such as farther from the window. In this connection, use of the present invention as described is far more convenient than one alternative such as assembling of an end plate-housing assembly followed by insertion of board 145. In this alternative case, positioning of the board 145 at a known location is both more difficult and more time-consuming, in that the board section contained within the chamber 120 is concealed from view.

As the construction of the pressurization chamber which houses the X-ray detector boards of the present invention has been described, attention will be turned now to the boards themselves.

Figure 11:
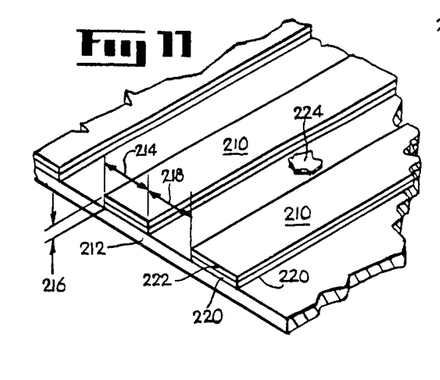
FIG. 11 illustrates a gold island between two detector elements.

One such detector board is shown in FIG. 11, which depicts an array of elongated, parallel, gold-chromium elements 210 supported on a substrate 212, each element being 4 mils (one mil being one thousandth inch) wide (dimension 214). The elements are one mil thick (dimension 216) and are spaced from their neighbors by 1.5 mil (dimension 218). The detector elements are manufactured in the following manner.

Figure 12:
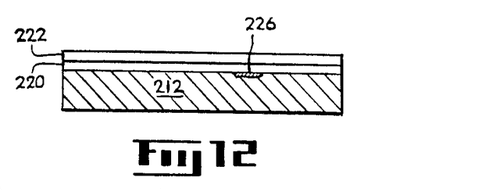
FIG. 12 is a side view of a gold island.

As shown in FIG. 12, a first layer 220, of chromium and 1 mil thick, is deposited onto the substrate 212 as known in the art. The substrate 212 is preferably composed of a glass-fiber-filled epoxy having a high glass fiber content, preferably 40% by volume. The importance of this high fiber content is later discussed. A second layer 222, composed of gold 1 mil thick, is deposited atop the chromium as known in the art.

The chromium assists the adhesion of the gold layer 222 to the substrate 212. Following the gold-chromium deposition, the layers are etched, in a first etching step, to form an array of detector elements having the dimensions stated above. One etching method is known in the art and includes the deposition of a photoresist in the pattern of the elements desired. An acid is applied to the board, and the acid etches away the regions unprotected by the photoresist. However, Applicant has found that, following etching, gold islands 224 nevertheless remain between the elements 210 as shown in FIG. 11. The gold islands 224 result partly from the fact that the substrate 212 in FIG. 12 contains minute scratches 226. The plating of gold and chromium enters the scratches, and is not fully etched away, leaving gold islands following etching. Applicant suspects that the gold islands are implicated in the spurious current (later discussed) and so Applicant has established the following procedure for reducing the concentration of gold islands.

Applicant repeats the etching process a second time, after removal of the photoresist. Then a washing step removes the remaining photoresist and acid. The double etching has been found to reduce the concentration of gold islands to thereby reduce the need for scrubbing which will not be described. However, it was found that the double etching can be undertaken without removing damaging quantities of gold from the elements.

Figure 13:
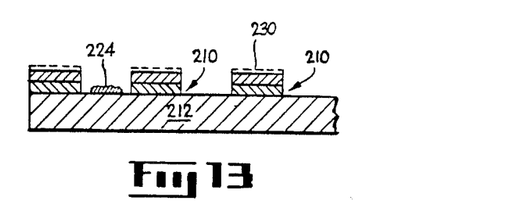
FIG. 13 illustrates regions of gold which are removed by abrasive scrubbing.

Following the double etching, the board-detector array is gently scrubbed with a water-based slurry of one-micron aluminum oxide particles. The gentle abrasive action serves to remove both residue of the etching process and microscopic debris, but not to destroy the detector elements 210. It is noted that the scrubbing, in removing debris and organic surface contaminants, such as gold islands 224 in FIG. 13 also removes some of the gold from the detector elements, as shown by dashed region 230. Applicant assumes that the same general thickness of material is removed from the detector elements 210 as from the gold islands. In order to prevent the accidental scrubbing away of elements, the elements are frequently observed by microscope to ascertain whether the concentration of gold islands has reached a threshold (later discussed). When the threshold is reached, scrubbing is stopped. These frequent observations reduce the possibility of accidental removal of an element. Following scrubbing, the board-detector array is ultrasonically cleaned as known in the art with an Alconox-water solution and allowed to dry. Alconox is available from VWR Scientific Company, P O Box 232, Boston, Mass. 02101.

The walls of the chamber 120 in FIG. 4 are also cleaned, but by first boiling Freon liquid onto the inner surface of the chamber, followed by ultrasonic cleaning as described above. The reasons for this extensive cleaning procedure will now be explained.

Applicant has found that, in the pursuit of higher speeds in reading the charge deposited onto the elements by ionized gas, unexpected difficulties are encountered. It was found that, following charge reading, an unknown source was providing a residual, spurious current through the elements which took approximately 30 seconds to decay. Of course, during the decay interval, the elements are not available for detection, and the speed of the detection process suffers.

Figure 26:
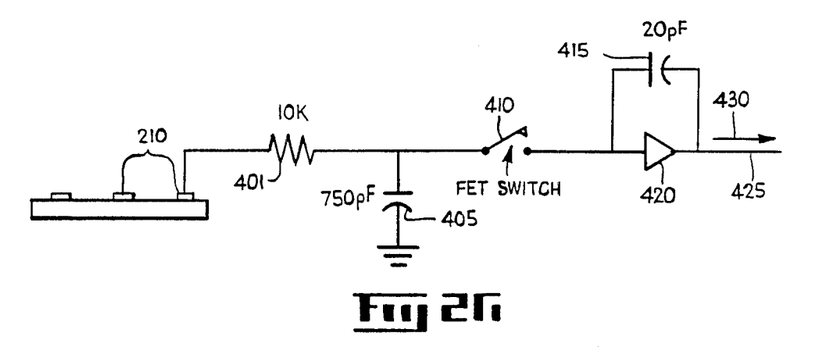
FIG. 26 illustrates a circuit used to read the charge deposited on the detector elements.

FIG. 26 is a schematic diagram of apparatus used to read the charge deposited upon the elements 6 shown in Figure. A 10 Kohm resistor 401 is connected between an element 6 and a 750 pF capacitor 405. Charge builds up on the capacitor 405 in response to charge deposition upon the element 6 as a result of ionization occurring above the element. When switch 410 is closed (a symbolic switch 410 is shown, but in actual practice an FET transistor is used) virtually all of the charge accumulates upon the 20 pF capacitor 415 associated with amplifier 420. An amplified voltage is provided on lead 425 which is a function of the charge on the capacitor 415. The amplified voltage can then be processed in any of several ways, such as by display on an oscilloscope (not shown).

The residual current described above takes the form of a current, shown as arrow 430, which continues to flow even after the voltage on each capacitor 405 has been read and the capacitor has been discharged. As mentioned, the current persists for 30 seconds.

Figure 27:
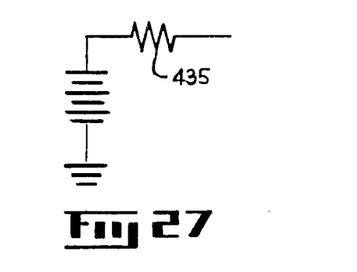
FIG. 27 illustrates a standard model of a current source.

This residual current, together with other evidence obtained by Applicant in examining the present invention, indicates that the detector array 210 in FIG. 11 behaves much like a high impedance current source. This is unusual, in that a current source is commonly modeled as shown by FIG. 27. A current source is expected to have a low impedance (shown by resistor 435) rather than the high impedance found by Applicant. In reducing the spurious current, Applicant has reduced the tendency of the detector array to behave as a high impedance current source.

Applicant has established the cleaning procedure described above with a view to reducing the spurious current. However, as will now be discussed, the reasons why the cleaning procedures do in fact reduce the spurious current are not clear.

In investigating the possible causes of the spurious current, some of the theories which describe events occurring during ionization in the chamber 120 will now be discussed. As the reader will see, the theories are not entirely consistent. Since the ionized xenon within the chamber 120 has some of the properties of a plasma, a plasma will first be discussed.

Figure 14:
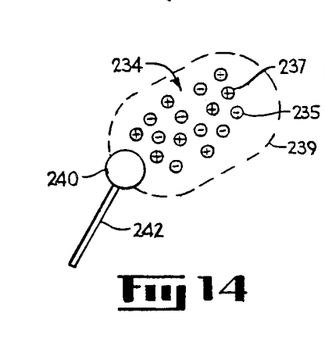

A generalized plasma 234 is shown in FIG. 14. The plasma comprises electrons 235 and positive ions 237 which have been separated from each other by collisions with X-ray photons. Applicant believes that space-charge neutrality exists within the plasma, meaning that in a macroscopic region 239 there exists no net charge. This is because the positive charges balance the negative charges in the region. The term "macroscopic" refers to a region large enough to contain many ionized atoms. This is in distinction to a region containing only one electron, which would, of course, contain a net charge, namely, that of the electron.

If a conductor 240 supported by an insulating rod 242 (analagous to a gold island 224 supported by the substrate 212) is inserted into plasma 234, Applicant believes that no net charge will deposit upon either the conductor or the rod because of space charge neutrality. Viewed another way, equal numbers of electrons and ions will be deposited upon the conductor and the insulator, so that no net charge is deposited upon either. Thus, insofar as the gold islands and the exposed substrate in FIG. 11 resemble the conductor 240 and the insulator 242 in FIG. 14, they are expected to acquire no charge from ionization events occurring near the detector elements.

However, parts of the plasma contained within the chamber 120 are subject to an electric field. For this reason, Applicant will now consider a plasma located within an electric field, such as plasma 244 in FIG. 15. The electric field is indicated as arrows 246, and is produced by the charges 248 and 250 on conductive plates 252 and 254.

Figure 15:
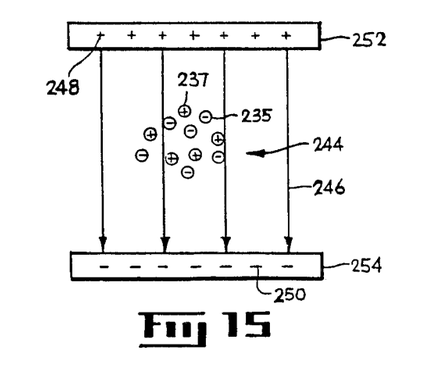

The electric field tends to separate the electrons 235 from the ions 237, the ions (being positive) will travel in the direction of the arrow 246, while the electrons (being negative) will travel in the opposite direction. The question arises as to whether space charge neutrality exists under these circumstances. Applicant believes that the answer is affirmative, under steady-state conditions.

Figure 16:
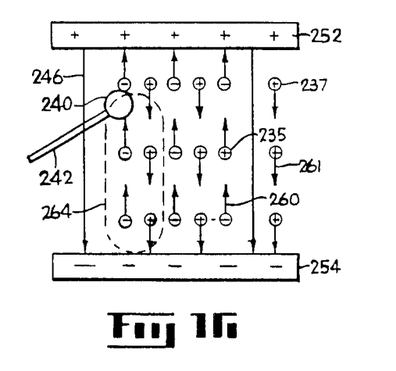

In the steady-state, a continual flow of ions 237 and electrons 235 as shown in FIG. 16 is maintained as shown by arrows 260 and 261. There is no net charge in a macroscopic region 264. This conclusion is consistent with the existence of space charge neutrality in a bar of semiconductor material carrying a current, if Hall effects are absent. In such a bar, electrons flow in one direction and holes flow in the opposite direction, but equal numbers of each exist in any macroscopic region. Accordingly, no net charge is expected to deposit upon the conductor 240 or upon the insulating support 242 in the steady-state.

The non-steady-state situations are probably different. As shown in FIG. 17, at the very onset of ionization, there may exist charge separation, as shown by separated charges 266 and 268. That is, prior to the establishment of the continual flow of electrons and ions in the steady-state, there may occur non-space charge neutrality. Similarly, following the termination of ionization, as the charges migrate to the plates 252 and 254 as shown in the sequence of events in FIGS. 18 and 19, there may exist charge separation, as in regions 272 and 274.

In either of the cases shown in FIGS. 17 or 19, if a conductor 240 connected to an insulator 242 is positioned as shown, either the conductor or the insulator may acquire some charge. However, Applicant does not know whether the conductor has a greater affinity for charge than the insulator. Further, Applicant believes that the time duration of the situations shown in FIGS. 17 and 19 may be so short (of the order of microseconds) that those situations may be ignored in the present analysis.

At this point, Applicant has uncovered no explanation which unambiguously indicates that charge will deposit upon either the gold islands or the adjacent exposed substrate. An analysis of the situation will now be undertaken from a different point of view. This new analysis will consider the role played by the particular configuration of the electric field pattern.

Figure 20:
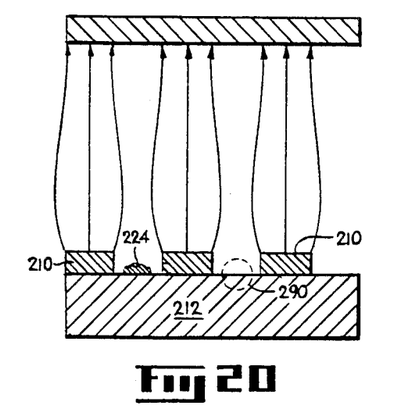
FIGS. 20 and 21 illustrate electric field lines terminating on the detector elements.
Figure 21:
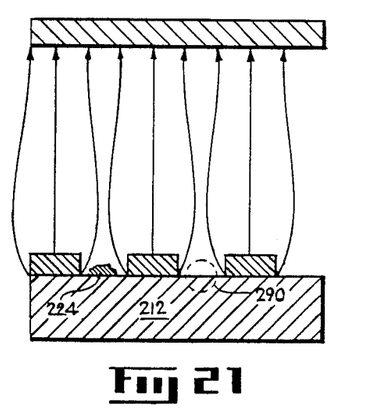

An electric field established between the plate 144 and the elements 210. The exact distribution of the field is difficult to ascertain, but it probably ranges between the two extremes shown in FIGS. 20 and 21. One significant feature of these distributions is that no field lines are shown as terminating on the substrate 212, nor upon the gold island 224. Further, no electric field lines pass through the gold islands 224, since the gold island 224 is a conductor. Further, there is no electric field in region 290.

The lack of an electric field in region 290 means that the analysis of the generalized plasma discussed in connection with FIG. 14 can be applied in this region. This analysis leads to the conclusion that no net charge should be deposited upon gold islands or substrate present in region 290. The field distribution of FIGS. 20 and 21 outside region 290 indicates also that no charge should be deposited upon the gold islands 224 or the substrate 212, as will now be discussed.

Figure 22:
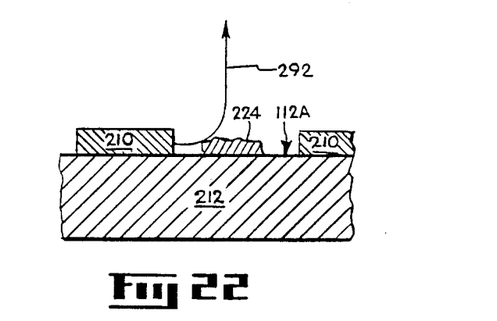
FIG. 22 illustrates a path taken by a charged particle.

Electrons from ionization events are driven by the field lines and the electrons tend to follow the field lines. Thus, the electrons following the field lines near the gold islands, such as line 292 in FIG. 22 will, it would seem, "brush along" the gold island 224 en route to the element 210, thereby depositing upon the element 210 and not upon the gold island 224.

At this point, again, no unambiguous explanation for collection of charge upon the gold islands or adjacent substrate has been offered. Nevertheless, Applicant now arbitrarily assumes that electrons do collect upon the gold islands and the adjacent substrate. Applicant will now analyze whether such an accumulation can contribute to the spurious current.

The gold island 224 and the neighboring exposed substrate 212A will be exposed to a shower of electrons resulting from ionization. This shower should be uniform across space. Thus, electrons fall equally upon the gold island 224 as upon the exposed substrate 212A. Applicant sees no clear reason why the electrons, having fallen onto the gold island 224 or the exposed substrate 212A, should then migrate to an element in the form of the spurious current. Further, removal of the gold island should not change the situation because then the electrons will collect on the newly exposed substrate located below the gold island. Again, Applicant sees no clear circumstances which involve the gold islands in the spurious current.

Even though, as the discussion above points out, it is not clear how the gold islands are implicated in the spurious current, Applicant hypothesizes that agents such as the gold islands, gaseous contaminants, residual contaminants from the photoetching process, or trace oils present on the walls of the chamber 120 in FIG. 4, singly or acting in combination, could have produced the spurious current. Each of these agents will briefly be discussed.

Gaseous contaminants can be introduced into the chamber 120 by the use of organics such as the rubber O-ring 18 of FIG. 2 or the various epoxies used as seals or substrate materials. Organics absorb atmospheric gases and, when placed into the xenon atmosphere of the chamber 120 in FIG. 4, tend to release the absorbed gases. The released gases may contribute to the spurious current. Applicant reduces the quantity of organics which contact the xenon by replacing the rubber O-ring 18 in FIG. 2 with a stainless steel O-ring 18 in FIG. 5 and by using glass-fiber-filled substrate 212. The glass fiber, an inorganic material, displaces organic material and thus reduces the quantity of organic material in contact with the xenon.

Residual photoetching contaminants and trace oils may have contributed to the spurious current. Applicant removes photoetching comtaminants in the scrubbing procedure described above. Applicant removes trace oils by dissolving them in boiling Freon, followed by subjecting the walls of the chamber 120 to ultrasonic cleaning, as described above.

Applicant removes the gold islands by the scrubbing procedure described above. Applicant has discovered that when the gold island concentration is reduced to (or below) a certain threshold, and when the cleaning procedures described above are followed, the spurious current is substantially eliminated. The threshold is defined as follows.

Figure 23:
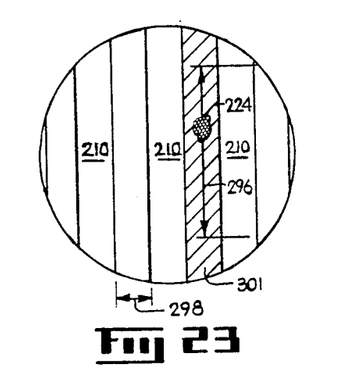
FIG. 23 illustrates the comparative areas of a gold island and exposed substrate.

A measurement of the surface area of the gold islands is taken through a microscope, viewing the array of elemens 210 from above as shown in FIG. 23. The element spacing is 1.5 mil (dimension 298). The ratio of gold island area (hatched area 224) to exposed substrate area (striped area 301) must not exceed 0.025: that is, the ratio of Island area/exposed substrate area=0.25%.

Associated components for supporting the detector assembly will now be discussed. As shown in FIG. 10, the housing assembly is supported on a platform 305. The substrate 212 supporting the detector array (not specifically shown) extends into the chamber 120. The voltage plate 308 is positioned below the substrate and parallel to the elements.

Figure 24:
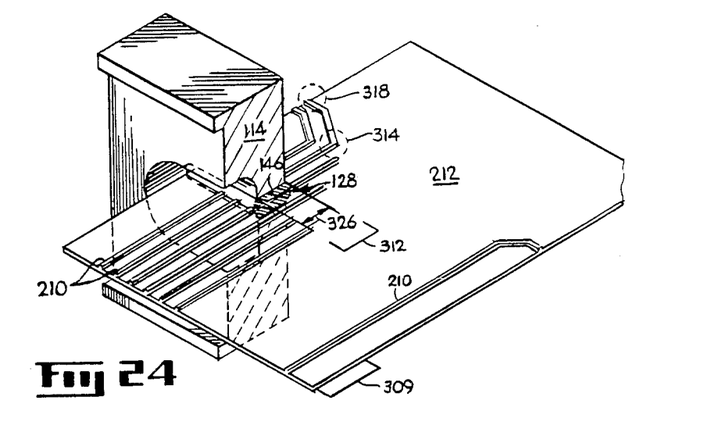
FIG. 24 illustrates the array of detector elements penetrating the slit in the end plate.

The substrate 212 is further shown in FIG. 24. Region 309 of the board is that inserted into the chamber 120. The elements 210 are shown, and they extend along the region 312 which is located within the slot 128 in FIG. 4. The elements continue, are splayed as shown in regions such as region 314, and continue to the edges of the substrate 212 as shown. In FIG. 10, connectors, preferably high density p.c. card to p.c. card connectors 316, are connected to the board edges at region 318 in FIG. 24 to establish contact with the elements 210. The connectors are fastened to ribbon cables 321 which are folded as shown and are in turn connected to signal processing circuitry (not shown). The ribbon cables are designed so that the lengths of all cables 321, from edge connectors 316 in FIG. 10 to terminations at the signal processor (not shown), are all identical.

The ribbon cables are supported by rigid brackets 323 in order to reduce vibration inflicted by external sources present in a factory environment. Vibration has been found to produce spurious signal readings and Applicant theorizes that the vibration affects the low-level signals carried by the ribbon cables.

In region 312 in FIG. 24 the array of elements 210 passes through the end plate and is fastened to the end plate by the epoxy seal 146. That is, there is a mechanical attachment between the array of elements and the walls of the slot 128. The physical length of this attachment (dimension 326) is preferably as small as possible, subject to strength requirements imposed by the need to contain the pressurized xenon within the chamber 120 in FIG. 4. The length 326 is preferably small for at least two reasons. One, it is preferred that the extent over which the epoxy seal contacts the array of elements be as small as possible. One reason is that the elements are very small, smaller than a human hair, and are thus delicate. The mechanical attachment between the elements and the end plate 114 through the epoxy seal has the effect of subjecting the elements to mechanical stresses of the end plate. For example, the yawning and bowing described above, together with thermal expansion and contraction, tend to work upon the elements.

A second reason for reducing length 326 is that the concentration of gold islands in region 312 must be reduced below the threshold identified earlier. This is because electron collection is believed to occur in region 312. Reducing length 326 also reduces the length of the array of elements which must meet the threshold requirements as to gold island concentration. This reduction increases the manufacturing yield, in terms of usable boards produced per production run, of the detector boards.

Thus, stainless steel, having higher strength than aluminum, is preferred in constructing end plate 114 because this allows length 326 to be reduced while maintaining the strength of the end plate.

In a second embodiment of the detector array, the elements 210 are constructed of nickel, and are manufactured as follows. In FIG. 11, the detector elements 210 are constructed of a gold layer 220 and a nickel layer 222. The gold layers 220 are attached to a stainless steel sheet 212. Then, the nickel layers are bonded to a glass-epoxy substrate (not shown) such as the type described above. The bond between the stainless steel and the gold is broken, as by peeling the stainless steel 212 from the gold. Following this, the gold is etched away from the nickel elements, leaving a detector array comprising detector elements which are preferably composed entirely of nickel. The spaces between the elements 210 are examined as above and gold islands are removed as described above. Of course, at this point the elements 210 are single layered and not double layered as shown in FIG. 11. One supplier which commercially manufactures nickel-gold arrays as just described is Augat Interconnection Systems, Pactel Products, Newberry Park, CA.

Applicant has found that the use of nickel elements 210 provides greater mechanical integrity in the elements in that electromigration problems associated with gold are reduced. Electromigration becomes important in detectors of small dimension. Applicant notes that, despite the increased resistivity of nickel over gold (nickel having roughly three times the resistivity of gold), Applicant has found that the use of nickel does not significantly degrade the very small currents involved in reading the charges deposited upon the elements 210.

One aspect of the present invention involves the use of manufacturing techniques similar to those in the prior art manufacture of printed circuit boards. However, an important feature of the present invention is the difference in functioning between it and prior art printed circuit boards. In general, prior art boards are used to handle large voltages (compared to those of the present invention) of the order of 2.5+015 volts and, further, are used to handle currents on the order of milliamps. The present invention, on the other hand, handles extremely small voltages, of the order of 100 mV, and, in one sense, is not concerned with the transfer of currents, but with the detection of accumulated charge on the elements. While it is strictly true that Applicant does transfer charge in the form of a current through resistor 401 in FIG. 25, the currents are so small, being in the nano- and picoamp range, that different principles of circuit board design and manufacture had to be developed. The functional differences between current behavior in prior art printed circuit boards and the detector array of the present invention were found to be so significant that prior art manufacturing standards and cleanliness tolerances were inadequate. Consequently, Applicant was required to undertake independent investigations to analyze the inadequacies and to develop the corrective approaches described above.

Applicant points out that the minute dimensions of the detector elements in the present invention could be attained easily using integrated circuit (IC) fabrication techniques. However, existing equipment used to fabricate IC's on silicon discs are limited as to the size of the disc which can be processed. Discs greater than about four inches in diameter cannot be processed. Since the detector board substrate 212 exceeds this limit, in measuring about 4×6 inches, these fabrication techniques could not be used.

Applicant further points out one important feature of the present invention. One type of circuit board initially tested was found to have a ratio of gold-island-area-to-area ratio of 0.01 (1%). This board produced the spurious current described above. A similar board was manufactured, having a gold island concentration below the threshold, and then scrubbed and ultrasonically cleaned as described above. The spurious current in the latter board was substantially eliminated. Applicant views it as surprising that a reduction in area of the gold islands by a factor of 4 (i.e., a change from an area ratio of 0.01 to 0.0025) decreased the spurious current's time constant (i.e., decay time) by a factor of 1800. The reduction in spurious current's time constant is disproportionately large as compared with the reduction in gold island concentration.

One important aspect of the present invention is the elimination of X-ray impermeable barriers in the dielectric above the elements 210. Prior art devices, as mentioned above, provide the barriers 3A in FIG. 1, which are sometimes made of tungsten, upon the theory that the barriers force the ion (or electron) resulting from an ionization event to impinge upon an element directly below, and not beside, the event. Applicant has found, however, that, even under the narrow one-mil spacing described above, that such barriers are not necessary. Thus, Applicant employs a homogeneous dielectric between the detectors 210 and voltage plate 308. The dielectric is homogeneous in the sense that it is xenon gas, as free of contaminants as feasible and uninterrupted by barriers positioned above the spaces between the detectors.

Further, the collecting portions of the elements 210 extend through the slot 128 and along the substrate in region 312 in FIG. 24, outside the chamber, but unchanged in cross-sectional geometry: the elements are rectangular in cross section as shown in FIG. 24 at all locations on the substrate, within the chamber (in region 313), within the slot (in region 313A), and outside the chamber (in region 314).

Figure 25:
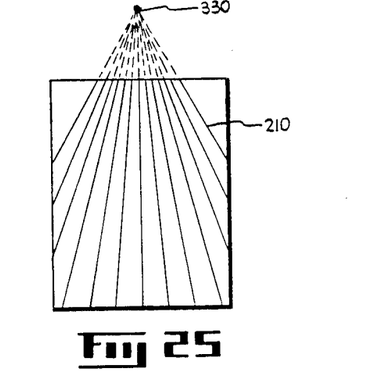
FIG. 25 illustrates a radial array of detector elements.

In another embodiment of the invention, the elements are not parallel as in FIG. 24, but are aligned along radii with respect to a center 330 as shown in FIG. 25. This radial alignment accommodates the fact that X-ray sources, such as an X-ray source designated as Philips Xray unit MCN 421 and available from Ridge, Inc., located in Atlanta, Ga., can be viewed as a point source when located greater than about 10 feet from the detector array.

As shown in FIG. 25, such a point source produces a fan-like X-ray beam which crosses the elements as shown. Accordingly, the X-rays are generally parallel to the radially positioned elements 210. This serves to increase resolution, in that a given ray 440 travels over one, and only one, element 210. In such a case, ideally, only one element 210 produces a signal in response to ionization events produced by ray 440, as opposed to two or more elements as in the case of parallel elements 6A–C in FIG. 1 in the case when barriers 3A are absent.

Numerous substitutions and modifications can be undertaken without departing from the true spirit and scope of the present invention.

What is desired to be secured by Letters Patent is the following.

I claim:

1. In an ionization detector comprising a plurality of parallel, elongated detector elements comprising nickel as a major constituent in each, a method of reducing the tendency of the elements to behave as high impedance current sources following exposure to an ion shower, the method comprising the following steps:
    (a) interposing a film of gold between each element and a sheet of stainless steel;
    (b) attaching the detector elements to a substrate;
    (c) removing the stainless steel sheet from the gold;
    (d) removing the gold from the detector elements; and
    (e) examining the spaces between the detector elements for metallic debris and, if the cross-sectional area of the debris exceeds 0.5% of the area of the spaces, reducing the amount of debris to below 0.5% by scrubbing the array with a water-based slurry of aluminum oxide particles.

2. A method according to claim 1 in which the aluminum oxide particles have a diameter of approximately one micron.

3. A method according to claim 1 and further comprising the step of removing organic contaminants from the detector elements by ultrasonic cleaning.

4. A method according to claim 1 and further comprising the step of applying etchant to the array after the removal step of (d) for the purpose of removing metallic debris from the spaces between the detector elements.

* * * * *